United States Patent
Cho et al.

(10) Patent No.: US 12,543,520 B2
(45) Date of Patent: Feb. 3, 2026

(54) METHOD FOR FORMING ELECTRODE

(71) Applicant: JUSUNG ENGINEERING CO., LTD., Gwangju-Si (KR)

(72) Inventors: Won Tae Cho, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 625 days.

(21) Appl. No.: 17/770,288

(22) PCT Filed: Nov. 24, 2020

(86) PCT No.: PCT/KR2020/016693
§ 371 (c)(1),
(2) Date: Apr. 20, 2022

(87) PCT Pub. No.: WO2021/112471
PCT Pub. Date: Jun. 10, 2021

(65) Prior Publication Data
US 2022/0392769 A1     Dec. 8, 2022

(30) Foreign Application Priority Data
Dec. 4, 2019  (KR) ................ 10-2019-0160178

(51) Int. Cl.
*H01L 21/285*       (2006.01)
*C23C 16/04*        (2006.01)
(Continued)

(52) U.S. Cl.
CPC ...... *H01L 21/28562* (2013.01); *C23C 16/042* (2013.01); *C23C 16/18* (2013.01);
(Continued)

(58) Field of Classification Search
CPC ........... H01L 21/28562; H01L 21/0228; C23C 16/042; C23C 16/18; C23C 16/45553; C23C 28/023; C25D 3/38; C25D 5/022
See application file for complete search history.

(56) References Cited

U.S. PATENT DOCUMENTS

| | | | |
|---|---|---|---|
| 2004/0070006 A1* | 4/2004 | Monty | G01N 33/005 257/200 |
| 2008/0093743 A1* | 4/2008 | Yang | H01L 23/5329 257/E21.038 |

(Continued)

FOREIGN PATENT DOCUMENTS

| | | | |
|---|---|---|---|
| CN | 101022080 A | 8/2007 | |
| CN | 101868762 A * | 10/2010 | ........... G03F 7/0754 |

(Continued)

OTHER PUBLICATIONS

Lee, et al.. (2009), Low-Temperature Atomic Layer Deposition of Copper Metal Thin Films: Self-Limiting Surface Reaction of Copper Dimethylamino-2-propoxide with Diethylzinc†. Angewandte Chemie International Edition, 4 (Year: 2009).*

(Continued)

*Primary Examiner* — Jarrett J Stark
(74) *Attorney, Agent, or Firm* — Renaissance IP Law Group LLP

(57) ABSTRACT

A method of forming an electrode in accordance with an exemplary embodiment includes a process of forming a mask pattern on one surface of a base to expose a partial area of the one surface of the base by using a mask material that is polymer including an end tail having at least one bonding structure of covalent bond and double bond, a process of loading the base on which the mask pattern is formed into a chamber, and a process of forming a conductive layer containing copper on the exposed one surface of the base by using an atomic layer deposition method that alternately (Continued)

injects a source material containing copper and a reactive material that reacts with the source material into the chamber.

Thus, according to the method of forming an electrode in accordance with an exemplary embodiment, a thin-film caused by a material for forming an electrode is not formed on a surface of the mask pattern. Therefore, a residue is not remained when the mask pattern is removed to prevent a defect caused by the residue from being generated.

5 Claims, 3 Drawing Sheets

(51) Int. Cl.
<table>
<tr><td>C23C 16/18</td><td>(2006.01)</td></tr>
<tr><td>C23C 16/455</td><td>(2006.01)</td></tr>
<tr><td>C23C 28/02</td><td>(2006.01)</td></tr>
<tr><td>C25D 3/38</td><td>(2006.01)</td></tr>
<tr><td>C25D 5/02</td><td>(2006.01)</td></tr>
<tr><td>C25D 7/12</td><td>(2006.01)</td></tr>
<tr><td>H01L 21/027</td><td>(2006.01)</td></tr>
<tr><td>H10D 30/67</td><td>(2025.01)</td></tr>
<tr><td>H10D 99/00</td><td>(2025.01)</td></tr>
</table>

(52) U.S. Cl.
CPC ...... *C23C 16/45553* (2013.01); *C23C 28/023* (2013.01); *C25D 3/38* (2013.01); *C25D 5/022* (2013.01); *C25D 7/123* (2013.01); *H01L 21/0272* (2013.01); *H10D 30/6755* (2025.01); *H10D 99/00* (2025.01)

(56) References Cited

U.S. PATENT DOCUMENTS

<table>
<tr><td>2009/0004385 A1</td><td>1/2009</td><td>Blackwell et al.</td></tr>
<tr><td>2011/0100453 A1*</td><td>5/2011</td><td>Clevenger ............ H10F 77/334<br>257/E31.124</td></tr>
<tr><td>2016/0032455 A1</td><td>2/2016</td><td>Liu et al.</td></tr>
</table>

FOREIGN PATENT DOCUMENTS

<table>
<tr><td>CN</td><td>102782624 A</td><td></td><td>11/2012</td><td></td></tr>
<tr><td>CN</td><td>103839883 A</td><td></td><td>6/2014</td><td></td></tr>
<tr><td>CN</td><td>104241408 A</td><td></td><td>12/2014</td><td></td></tr>
<tr><td>KR</td><td>20010003400 A</td><td></td><td>1/2001</td><td></td></tr>
<tr><td>KR</td><td>20010082828 A</td><td></td><td>8/2001</td><td></td></tr>
<tr><td>KR</td><td>20110003775 A</td><td></td><td>1/2011</td><td></td></tr>
<tr><td>KR</td><td>20130113234 A</td><td></td><td>10/2013</td><td></td></tr>
<tr><td>KR</td><td>20130119532 A</td><td></td><td>11/2013</td><td></td></tr>
<tr><td>KR</td><td>20140068721 A</td><td></td><td>6/2014</td><td></td></tr>
<tr><td>KR</td><td>20150075049 A</td><td>*</td><td>7/2015</td><td>....... C23C 16/45553</td></tr>
<tr><td>KR</td><td>20150113041 A</td><td></td><td>10/2015</td><td></td></tr>
<tr><td>TW</td><td>I867102 B</td><td>*</td><td>12/2024</td><td>......... H01L 21/0272</td></tr>
<tr><td>WO</td><td>WO-2021112471 A1</td><td>*</td><td>6/2021</td><td>............. C23C 28/32</td></tr>
</table>

OTHER PUBLICATIONS

Mechanism for the Atomic Layer Deposition of Copper Using Diethylzinc as the Reducing Agent: A Density Functional Theory Study Using Gas-Phase Molecules as a Model, J. Phys. Chem. A 2012, 116, 35, 8893-8901 (Year: 2012).*

Zhenyu et al. Nanometer-thick copper films grown by thermal atomic layer deposition, Thin Solid Films vol. 589, Aug. 31, 2015, pp. 673-680 (Year: 2015).*

Investigation of AlMe3, BEt3, and ZnEt2 as Co-Reagents for Low-Temperature Copper Metal ALD/Pulsed-CVD Balamurugan Vidjayacoumar, David J. H. Emslie, Scott B. Clendenning, James M. Blackwell, James F. Britten, and Arnold Rheingold Chemistry of Materials 2010 22 (17), 4844-4853 (Year: 2010).*

Miikkulainen et al., Highly Material Selective and Self-Aligned Photo-assisted Atomic Layer Deposition of Copper on Oxide Materials. Adv. Mater. Interfaces 2021, 8, 2100014. htttps://doi.org/10.1002/admi.202100014 (Year: 2021).*

International Search Report for PCT/KR2020/016693 mailed Mar. 8, 2021.

Written Opinion for PCT/KR2020/016693 mailed Mar. 8, 2021.

* cited by examiner

METHOD FOR FORMING ELECTRODE

BACKGROUND

The present disclosure relates to a method of forming an electrode, and more particularly, to a method of forming an electrode, which is capable of preventing a defect and insulation breakdown from being generated.

A thin-film transistor (TFT) is used as a circuit for independently driving each pixel in a liquid crystal display (LDC), an organic electro luminescence (EL) display, and the like. The thin-film transistor is formed on a lower substrate of a display device in conjunction with a gate line and a data line. That is, the thin-film transistor includes a gate electrode that is a portion of the gate line, an activation layer used as a channel, source and drain electrodes that are a portion of the data line, and a gate insulation layer.

When the gate electrode is formed on the substrate, a process of forming a conductive layer and a process of patterning the conductive layer are generally provided. Also, when the conductive layer is patterned, a wet etching method using etchant or a chemical mechanical polishing (CMP) method is performed.

Here, a residue may be remained on an area of one surface of the substrate, from which the conductive layer is removed, during the process of patterning. Thus, the residue may generate a limitation such as a defect or insulation breakdown to cause failure or degradation in quality of the thin-film transistor.

Also, since the process of patterning the conductive layer is inevitably performed after the conductive layer is formed to form an electrode, a total process becomes complicated.

RELATED ART DOCUMENT

Patent Document (Patent document 1) Korean Patent Publication No. 2001-0003400

SUMMARY

The present disclosure provides a method of forming an electrode, which is capable of preventing a defect and insulation breakdown.

The present disclosure also provides a simple method of forming an electrode.

In accordance with an exemplary embodiment, a method of forming an electrode includes: loading, into a chamber, a base in which a partial area of one surface thereof is exposed by forming a mask pattern made of polymer on the one surface thereof; and forming a conductive layer containing copper on the partial area of the one surface of the base by alternately injecting a source material containing copper and a reactive material that reacts with the source material into the chamber.

In an exemplary embodiment, a polymer material not having a hydroxyl functional group (—OH) and an amino functional group (—NH) at an end tail thereof may be used as a mask material for forming the mask pattern.

In an exemplary embodiment, at least one of PMMA (poly(methyl methacrylate)), PtBMA (poly(tert-butyl methylacrylate)), PVP (poly(vinyl pyrrolidone)), PMAM (poly(methyl methacrylamide)), PS-b-PMMA (polystyrene-block-poly(methyl methacrylate)) may be used as the mask material.

In an exemplary embodiment, a conductive layer may be formed on the exposed one surface of the base by adsorbing the source material injected into the chamber to the exposed one surface of the base and allowing the reactive material to react with the source material adsorbed to the base, and the adsorbing of the source material and the allowing of the reactive material to react with the source material may be repeated a plurality of times.

In an exemplary embodiment, diethyl zinc ($Zn(C_2H_5)_2$) (DEZ) may be used as the reactive material.

In an exemplary embodiment, in the forming of the conductive layer, an inner temperature of the chamber may be adjusted at 350° C. or less.

In an exemplary embodiment, the forming of the conductive layer may include forming a secondary layer, which is performed after forming a primary layer, which is the forming of the conductive layer on the one surface of the base, to form an additional conductive layer on the conductive layer formed in the forming of the primary layer by performing electro-plating using the conductive layer formed in the forming of the primary layer as a seed.

In an exemplary embodiment, the method may further include removing the mask pattern by using organic solvent or plasma that is generated by using at least one of oxygen and hydrogen after the forming of the conductive layer is finished.

In an exemplary embodiment, the base may be one of a metal substrate, a substrate on which a metal oxide layer is formed, a glass substrate, a flexible plastic substrate, and a substrate on which an organic layer is formed.

In an exemplary embodiment, the metal substrate may include at least one of silicon (Si) and germanium (Ge), and the substrate on which a metal oxide layer is formed may be a substrate on which a thin-film made of at least one of silicon dioxide ($SiO_2$), zirconium oxide ($ZrO_2$, $Zr_2O_3$), hafnium oxide ($HfO_2$, $Hf_2O_3$), aluminum oxide ($Al_2O_3$), and IGZO is formed.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
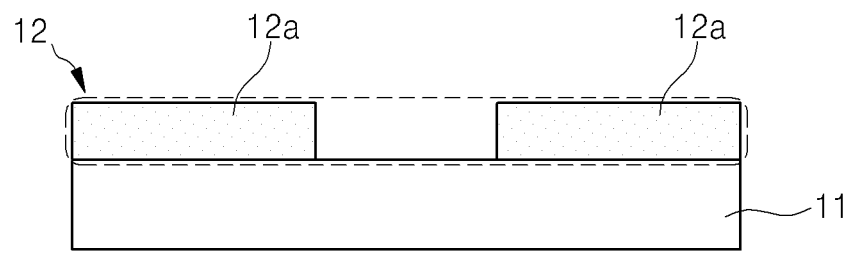
FIGS. 1 to 3 are views illustrating a method of forming an electrode in accordance with an exemplary embodiment.

Hereinafter, specific embodiments will be described in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

Figure 2:
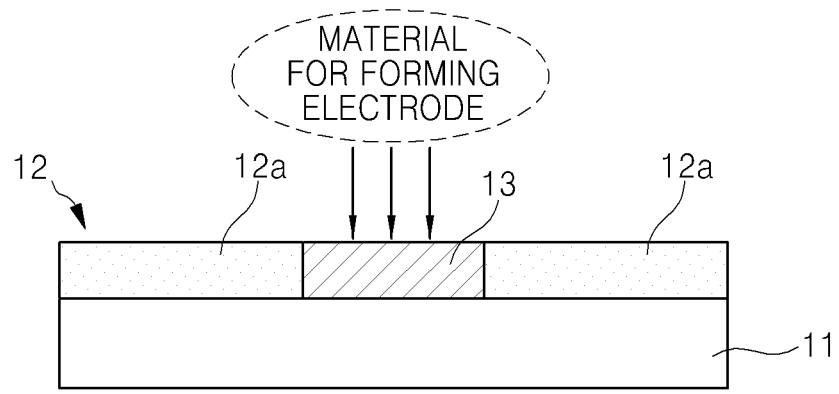
Figure 3:
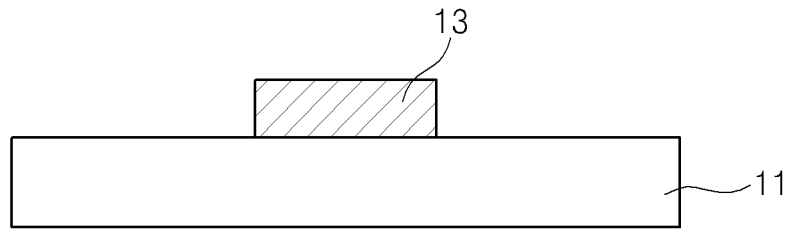
Figure 4:
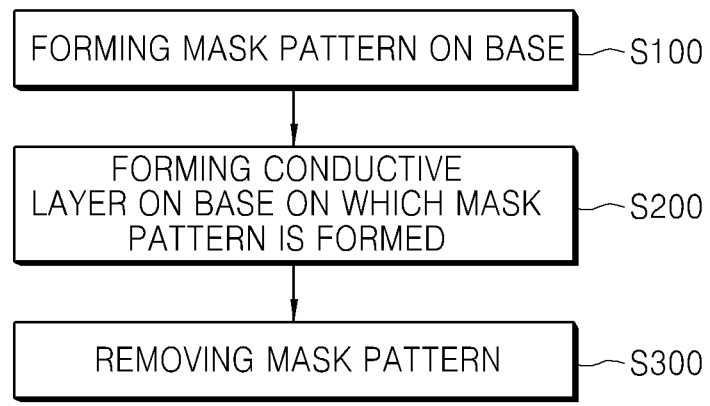
FIG. 4 is a flowchart representing the method of forming an electrode in accordance with an exemplary embodiment.

FIGS. 1 to 3 are views illustrating a method of forming an electrode in accordance with an exemplary embodiment. FIG. 4 is a flowchart representing the method of forming the electrode in accordance with an exemplary embodiment.

Referring to FIGS. 1 to 4, the method of forming the electrode in accordance with an exemplary embodiment includes a process S100 of forming a mask pattern 12 on a target object (hereinafter, referred to as a base 11) on which an electrode 13 is formed and a process S200 of forming a conductive layer, i.e., the electrode 13, by injecting a material to the base 11 on which the mask pattern 12 is formed. Also, the method of forming the electrode may further include a process S300 of removing the mask pattern 12 after the electrode 13 is formed.

The base 11 may be a metal substrate, a substrate on which a metal oxide layer is formed, a glass substrate, or a flexible plastic substrate such as PE, PES, PET, and PEN.

Here, the metal substrate may be made of metal and include at least one of silicon (Si) and germanium (Ge).

Also, the substrate on which a metal oxide layer is formed may be formed such that a metal oxide layer is formed on a substrate made of at least one of metal, glass, and plastic. Here, the metal oxide layer may be made of at least one of silicon dioxide ($SiO_2$), zirconium oxide ($ZrO_2$, $Zr_2O_3$), hafnium oxide ($HfO_2$, $Hf_2O_3$), aluminum oxide ($Al_2O_3$), and IGZO. The IGZO may be formed by doping indium (In) and gallium (Ga) to zinc oxide (ZnO).

Since the metal substrate, the substrate on which the metal oxide layer is formed, the glass substrate, or the flexible plastic substrate is used as the base 11 as described above, the base 11 may be described to include any one of metal, metal oxide, glass, and plastic.

The above-described base 11 may be a substrate having one surface on which a gate electrode is formed to manufacture a thin-film transistor or a substrate on which a gate electrode, a gate insulation layer, and an activation layer are laminated, and source and drain electrodes are formed on the activation layer to manufacture a thin-film transistor. Also, the base 11 may be a substrate on which an anode electrode is formed to manufacture an organic light emitting device.

Also, each of the metal substrate and the substrate on which the metal oxide is formed may be a substrate for manufacturing a thin-film transistor. Also, each of the glass substrate and the flexible plastic substrate may be a substrate for manufacturing a thin-film transistor or an organic light emitting device.

Also, the base 11 may be a substrate on which an organic layer is formed. More specifically, the base may be manufactured by laminating an anode electrode and an organic layer on the glass substrate or the flexible plastic substrate for manufacturing the organic light emitting device. Thus, the base 11 may be described to include the substrate and the organic layer formed on the substrate. Also, the organic layer may include a hole injection layer, a hole transport layer, a light emitting layer, and an electron transport layer, which are sequentially laminated on the anode.

Thus, the electrode 13 formed on the base 11 by the method in accordance with an exemplary embodiment may be an electrode of the thin-film transistor or an electrode of the organic light emitting device. More specifically, the electrode 13 formed by the method in accordance with an exemplary embodiment may be at least one of a gate electrode and a drain electrode of the thin-film transistor or an anode electrode and a cathode electrode of the organic light emitting device. In other words, at least one of the gate electrode and the drain electrode of the thin-film transistor and the anode electrode and the cathode electrode of the organic light emitting device may be formed by the method of forming the electrode in accordance with an exemplary embodiment.

In an exemplary embodiment, the mask pattern 12 is formed on the base 11, and then the electrode 13 including copper (Cu) is formed.

First, a method of forming the electrode 13 including copper (Cu) will be simply described. In an exemplary embodiment, the electrode 13 is formed by an atomic layer deposition (ALD) method. That is, an electrode is formed by a method of alternatively injecting a precursor that is a source material containing copper and a reactive material that reacts with the source material into a chamber in which the base 11 is seated. When the source material is injected into the chamber, the source material is adsorbed to a surface of the base 11, and then when the reactive material is injected, the reactive material reacts with the source material adsorbed on the base 11 to form a conductive layer. Here, the conductive layer exposed by the mask pattern 12 and formed on one surface of the base 11 is the electrode 13.

At least one of $Cu(dmamb)_2$(Bis(dimethylamino-methyl-butoxy)copper(II)) and $Cu(dmamp)_2$(Bis(dimethylamino-2-methyl-2-propoxy)Cu(II)) may be used as the source material containing copper, i.e., the precursor. Also, diethyl zinc ($Zn(C_2H_5)_2$)(DEZ)) may be used as the reactive material.

When the conductive layer, i.e., the electrode 13, is formed on one surface of the base, the electrode 13 is formed on a partial area of the one surface. That is, the electrode 13 is selectively formed on only a partial area of the one surface of the base 11 instead of being formed on the entire one surface of the base 11.

To this end, in an exemplary embodiment, the mask pattern 12 is formed on one surface of the base 11 as in FIG. 1 before a process of forming the electrode 13. That is, in the one surface of the base 11, an area on which the electrode 13 is formed is exposed, and the mask pattern 12 that forms a layer (hereinafter, referred to as a shielding layer 12a) is formed on the rest area. As described above, since the mask pattern 12 is formed by forming the shielding layer 12a on one surface of the base 11 to expose the area on which the electrode 13 is formed, the mask pattern 12 may be described to include the shielding layer 12a.

When the mask pattern 12 is formed on one surface of the base 11, the electrode 13 is formed on only the area exposed by the mask pattern 12. That is, the source material is adsorbed to only the area exposed by the mask pattern 12, and the adsorbed source material reacts with the reactive material to form the electrode 13. Also, in the one surface of the base 11, since the shielding layer 12a is formed on the rest area except for the area exposed by the mask pattern 12, a material for forming an electrode, i.e., the source material and the reactive material, is not reached to an area shielded by the shielding layer 12a, and the electrode is not formed thereon.

In an exemplary embodiment, in the one surface of the base 11, a thin-film caused by the material for forming electrode is neither formed on the area shielded by the mask pattern 12 nor_on the mask pattern 12 in the one surface of the base 11.

To this end, a polymer is used as a material (hereinafter, referred to as a mask material) for forming the mask pattern 12 because the polymer does not chemically bond to and react with the material for forming the electrode, and the material for forming the electrode is not or hardly adsorbed to the polymer. More desirably, the mask material may be a material, to which the source material for forming the electrode 13 is not or hardly adsorbed and which does not chemically bond to or react with the source material.

Also, the mask material may be a material, to which the source material for forming the electrode is not or hardly adsorbed and which does not chemically bond to or react with the source material at a temperature of 350° C. or less, more preferably in a range from 100° C. to 300° C. Also, the mask material may be a polymer material in which association or bonding is not broken at a temperature of 350° C. or less.

To this end, in an exemplary embodiment, a polymer material having an end tail forming covalent bond or double bond instead of having a functional group consisting of a hydroxyl group (—OH) or an amino group (—NH) at an end tail in a chemical structure is used as the mask material.

A bond structure of the covalent bond or the double bond has greater binding energy than that of a single bond of the hydroxyl group (—OH) or the amino group (—NH). Also, stability of the bond structure increases as the binding energy increases. Thus, in case of the material having an end tail forming covalent bond or double bond, reaction or chemical bond with another material is not generated, and adsorption is not also generated.

As a specific example, the mask material may be one of PMMA (poly(methyl methacrylate)), PtBMA (poly(tert-butyl methylacrylate)), PVP (poly(vinyl pyrrolidone)), PMAM (poly(methyl methacrylamide)), PS-b-PMMA (polystyrene-block-poly(methyl methacrylate)).

When the mask pattern 12 is made of a material having a hydroxyl functional group (—OH) or an amino functional group (—NH) at an end tail, the material for forming the electrode 13, i.e., the source material, may be adsorbed or chemically bonded to a surface of the mask pattern 12, or react with the mask pattern 12. Thus, a thin-film, i.e., a conductive layer, caused by the source material may be formed on the mask pattern 12. This phenomenon is generated because the material having the hydroxyl functional group (—OH) or the amino functional group (—NH) is easily chemically bonded to or react with another material. Thus, a limitation is generated such that the conductive layer is formed on not only the exposed area but also the surface of the mask pattern 12 in the one surface of the base, and the conductive layer is connected to the electrode 13 formed in the area exposed by the mask pattern 12 during the process of forming the electrode.

However, in an exemplary embodiment, since the mask pattern 12 is formed by using the polymer material not having the hydroxyl functional group (—OH) or the amino functional group (—NH) at the end tail, more particularly the polymer material described as in the above exemplary embodiment, the material for forming the electrode, i.e., the source material, is not adsorbed to, not chemically bonded to, or does not reacts with the mask pattern 12. Thus, the material for forming the electrode is not deposited on or does not form a thin-film on the surface of the mask pattern 12. That is, the source material is adsorbed to only the area exposed by the mask pattern 12 in the one surface of the base 11, and the adsorbed source material reacts with the reactive material to form the electrode only on the exposed area instead of forming the electrode on the mask pattern 12. Here, although the source material may be adsorbed or seated on the surface of the mask pattern 12, since only an extremely small amount of the source material may be adsorbed or seated thereon, a thin-film is not formed thereon.

The process of forming the mask pattern 12 on one surface of the base 11 may include a process of forming a coating layer on one surface of the base 11 by using the mask material and a process of patterning the coating layer to expose an area on which the electrode 13 is formed in the one surface of the base 11.

The mask material may be in a paste, liquid, or film state having a predetermined viscosity.

Also, when the coating layer is formed by using the mask material, the mask material may be applied by a spin coating method or a printing method to form the coating layer. Also, the coating layer may be formed by applying the mask material and then curing the applied mask material by a thermal-curing or photo-curing method.

The process of patterning the coating layer removes the coating layer formed on the area on which the electrode 13 is formed in the one surface of the base 11 to expose the removed area. When the coating layer is patterned as described above, the mask pattern 12 is formed such that the shielding layer 12a is formed on the rest area except for the area on which the electrode 13 is formed. The above-described process of patterning the coating layer may be performed through an electron beam lithography method.

Hereinabove, the process of forming the mask pattern by forming the coating layer on the surface of the base 11 and then patterning the coating layer is described. However, the exemplary embodiment is not limited thereto. For example, the mask pattern 12 may be directly formed by an ink jet printing method. That is, the mask pattern 12 may be formed by directly forming the shielding layer 12a on the rest area except for the area on which the electrode 13 is formed in the one surface of the base 11.

When the mask pattern 12 is formed to expose the area on which the electrode 13 is formed in the one surface of the base 11, the electrode 13 is formed on the base 11. To this end, the base 11 is loaded into a chamber of a substrate process apparatus in which the electrode 13 is formed.

Here, the substrate process apparatus may form a thin-film by an atomic layer deposition (ALD) method. More specifically, the substrate process apparatus may include a chamber having an inner space, a susceptor disposed in the chamber and on which the base 11 is seated, and an injection unit for injecting a material for forming an electrode toward the base. Here, the injection unit may alternately inject a source material for forming the electrode, a reactive material for reacting with the source material, and a purge material toward the base.

When the base 11 on which the mask pattern 12 is formed is seated on the susceptor in the chamber, the base 11 is heated at a temperature of 350° C. or less, preferably a temperature of 100° C. to 300° C. Thereafter, the injection unit is operated to alternately inject the source material, the reactive material, and the purge material several times toward the base 11.

Thus, the electrode 13 is formed on the one surface of the base 11 on which the mask pattern 12 is formed. That is, the conductive layer, i.e., the electrode 13, is formed as the source material is adsorbed to the area exposed by the mask pattern 12 in the one surface of the base 11, and the adsorbed source material reacts with the reactive material. More specifically, the source material containing copper, e.g., at least one of Cu(dmamb)$_2$(Bis(dimethylamino-methyl-butoxy)copper(II)) and Cu(dmamp)$_2$(Bis(dimethylamino-2-methyl-2-propoxy)Cu(II)), is adsorbed to the area exposed by the mask pattern 12 in the one surface of the base 11. Thereafter, the adsorbed source material reacts with diethyl Zinc (Zn(C$_2$H$_5$)$_2$)(DEZ) that is the reactive material to form the conductive layer containing copper (Cu), i.e., the electrode 13.

When a feature of sequentially injecting 'the source material, the reactive material, and the purge material' is referred to as one cycle, the electrode is formed with a target thickness by performing the cycle a plurality of times.

Also, when the electrode 13 having a thickness of 100 nm or more is formed, the electrode may be formed through two processes. That is, the electrode 13 may be formed such that a primary conductive layer (hereinafter, referred to as a first layer) is firstly formed by the atomic layer deposition method, and then a secondary conductive layer (hereinafter, referred to as a second layer) is formed on the first layer by a method having a faster layer growing speed than the atomic layer deposition method, e.g., an electro-plating method.

When the second layer is formed by the electro-plating method, the first layer serves as a seed for the electro-plating. That is, the seed (first layer) containing copper is formed by the atomic layer deposition method, and the second layer is formed on the seed through the electro-plating.

In order to form the second layer through the electro-plating, an electrolyte solvent containing copper (Cu) is prepared, and a copper (Cu) plate is prepared. Then, the base 11 on which the first layer, i.e., the seed, is formed and the copper plate are submerged in the electrolyte solvent. Thereafter, when a direct current power is applied by using the base 11 as a negative electrode (−) and the copper plate as a positive electrode (+), the copper (Cu) is plated on the seed to form the second layer.

When the electrode is formed on the one surface of the base 11, the mask pattern 12 is removed as in FIG. 3. Here, the mask pattern 12 may be cleaned and removed by using an organic solvent such as isopropyl alcohol (IPA). Since the organic solvent is used to clean and remove the mask pattern 12, although an oxide layer or an organic layer is formed on the mask pattern 12, the cleaning and removing of the mask pattern 12 is not affected. Thus, an oxide layer or an organic layer is not removed, or properties thereof are not degraded.

Although the method of using the organic solvent to remove the mask pattern 12 is described above, the exemplary embodiment is not limited thereto. For example, the mask pattern 12 may be removed by a dry cleaning method using plasma that is formed by using a material containing at least one of oxygen (O$_2$) and hydrogen (H$_2$).

As described above, in an exemplary embodiment, the electrode 13 may be selectively formed on the one surface of the base 11 by performing the process of forming the electrode on the base 11 on which the mask pattern 12 is formed. Thus, a process of forming the conductive layer for forming the electrode on the base 11 and then patterning the conductive layer, e.g., a wet etching or a chemical mechanical polishing (CMP) process, may be omitted. Thus, the process of forming the electrode 13 may be further simplified, and thus a production rate may improve.

Also, since the mask pattern 12 is made of the polymer material to which the material for forming the electrode is not or hardly adsorbed and which is not chemically bonded to or does not react with the material for forming the electrode, the conductive layer caused by the material for forming the electrode is not formed on the surface of the mask pattern 12. Also, since the conductive layer is not formed on the mask pattern when the electrode is formed, it will be described that the conductive layer connected to the electrode is not formed on the mask pattern 12.

As described above, since the conductive layer is not formed on the mask pattern 12 when the electrode 13 is formed, a residue is not remained on the area of the base 11, on which the mask pattern 12 is formed, when the mask pattern 12 is removed. Thus, a limitation such as defect generation and insulation breakdown caused by the residue may be prevented.

Also, since the conductive layer connected to the electrode is not formed on the mask pattern 12, the electrode may not be damaged in the process of removing the mask pattern 12 to prevent insulation breakdown of the electrode 13 from being generated.

Figure 5:
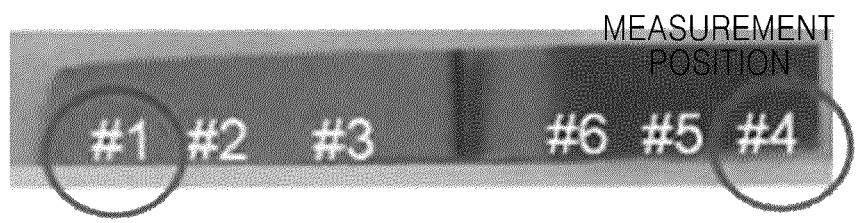
FIG. 5 is a photograph of a specimen of an exemplary experiment of performing a process of forming a conductive layer containing copper (Cu)
Figure 6:
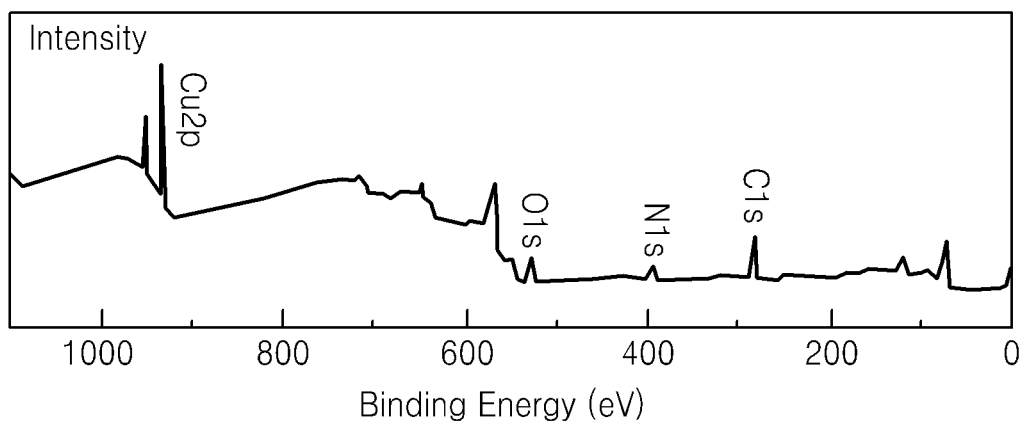
FIGS. 6 and 7 are X-ray photoelectron spectroscopy (XPS) graphs of a specimen that has undergone the process of forming the conductive layer containing copper (Cu)
Figure 7:
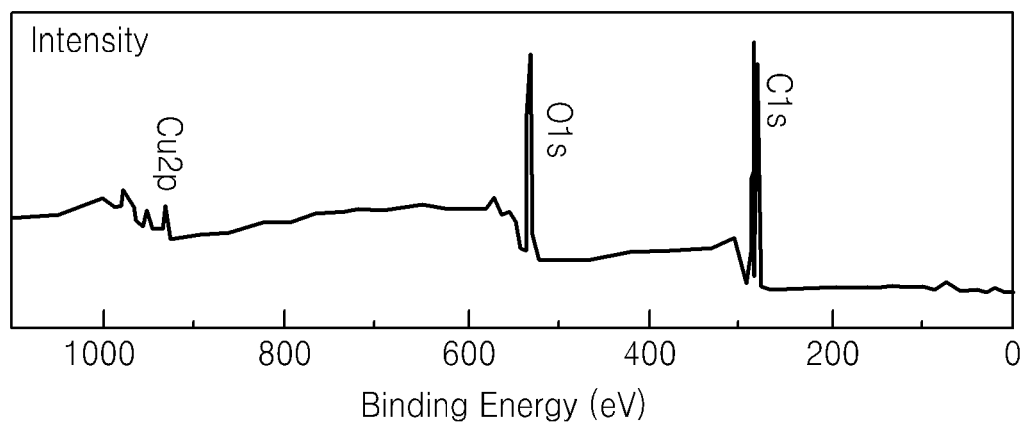

FIG. 5 is a photograph of a specimen of an exemplary experiment of performing a process of forming a conductive layer containing copper (Cu). FIGS. 6 and 7 are X-ray photoelectron spectroscopy (XPS) graphs of a specimen that has undergone the process of forming the conductive layer containing copper (Cu).

Table 1 shows an atomic ratio (at %) of a material detected at a first position (#1) and a fourth position (#4) on a surface of the specimen that has undergone the process of forming the conductive layer containing copper (Cu).

TABLE 1

| | Cu (at %) | C (at %) | O (at %) | N (at %) |
|---|---|---|---|---|
| First position (#1) | 21.04 | 58.58 | 12.00 | 8.37 |
| Fourth position (#4) | 1.22 | 75.49 | 23.29 | 0 |

For the experiment, the same base, i.e., a metal substrate (or a silicon wafer) made of silicon, is prepared.

Also, in one base, a coating layer made of a PMMA polymer material is formed at each of a fourth position (#4), a fifth position (#5), and a sixth position (#6), and the coating layer is not formed at each of a first position (#1), a second position (#2), and a third position (#3). Thereafter, the process of forming the conductive layer containing copper (Cu) is performed on the base by using the atomic layer deposition method.

Referring to FIGS. 6 and 7 and table 1, while almost no copper (Cu) is detected on the surface of the specimen on which the PMMA coating layer is formed, a large amount of copper (Cu) is detected on the surface of the specimen on which the coating layer is not formed. Only an extremely small amount of copper (Cu), which may not form a thin-film, is detected at the fourth position (#4) on which the PMMA coating layer is formed.

From the above result, it may be understood that the conductive layer caused by the material for forming the electrode, i.e., the source material, is not or hardly formed when the process of forming the electrode is performed on the base on which the mask pattern is formed in accordance with an exemplary embodiment.

Figure 8:
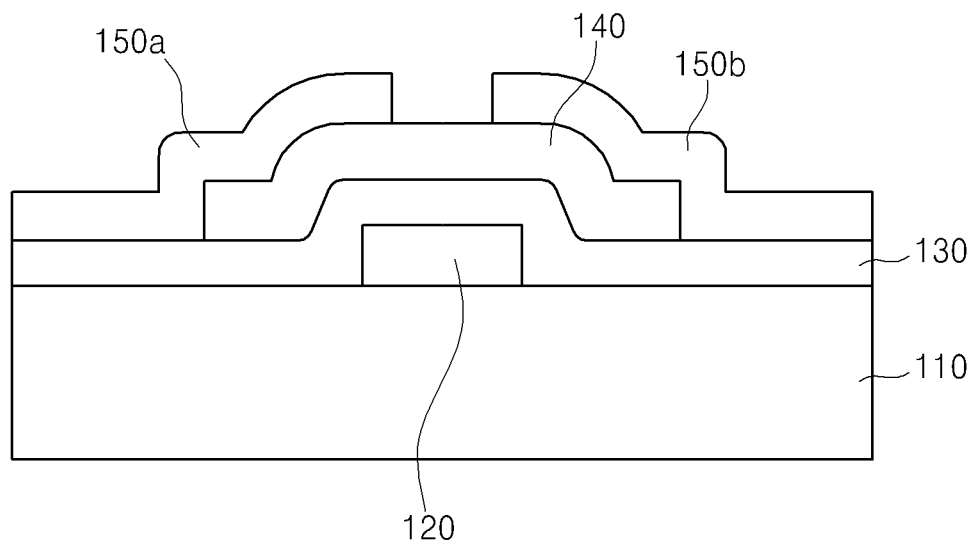
FIG. 8 is a view illustrating a thin-film transistor in which an electrode is formed by the method in accordance with an exemplary embodiment.

FIG. 8 is a view illustrating a thin-film transistor in which an electrode is formed by the method in accordance with an exemplary embodiment.

Hereinafter, a method of forming a thin-film transistor and an electrode by using the method in accordance with an exemplary embodiment will be described with reference to FIGS. 1 to 4 and 8. Here, a method of forming a thin-film transistor and an electrode by using the method in accordance with an exemplary embodiment will be described.

First, a base is prepared. Here, the base may be one of a metal substrate, a substrate on which a metal oxide layer is formed, a glass substrate, or a flexible plastic substrate such as PE, PES, PET, and PEN.

Hereinafter, a substrate on which a gate electrode is formed for manufacturing the thin-film transistor is referred to as the base, and the base is indicated by reference numeral 110 in FIG. 8. Also, an electrode formed on the base 110 is referred to as the gate electrode, and the gate electrode is indicated by reference numeral 120.

When the base 110 is prepared, a mask pattern 12 is formed on one surface of the base 110. Here, as illustrated in FIG. 1, the mask pattern is formed to form a shielding layer 12a on an area except for an area on which the gate electrode 120 is formed. Here, the mask pattern is made of at least one of PMMA (poly(methyl methacrylate)), PtBMA (poly(tert-butyl methylacrylate)), PVP (poly(vinyl pyrrolidone)), PMAM (poly(methyl methacrylamide)), PS-b-PMMA (polystyrene-block-poly(methyl methacrylate)).

When the mask pattern 12 is formed on the one surface, the gate electrode 120 is formed on the one surface of the base 110 as in FIGS. 2 and 4. To this end, the base 110 on which the mask pattern 12 is formed is loaded into a chamber of a substrate processing apparatus for forming the electrode and seated on a susceptor. Thereafter, the base 110 is heated at a temperature of 350° C. or less, more preferably a temperature of 100° C. to 300° C.

Also, a source material containing copper, a reactive material that reacts with the source material, and a purge material are alternately injected into the chamber by using an injection unit. Here, the source material may be at least one of $Cu(dmamb)_2$(Bis(dimethylamino-methyl-butoxy)copper(II)) and $Cu(dmamp)_2$(Bis (dimethylamino-2-methyl-2-propoxy)Cu(II)), the reactive material may be diethyl zinc $(Zn(C_2H_5)_2)$(DEZ), and the purge material may be nitrogen.

When the source material is injected into the chamber, the source material is adsorbed to an area exposed by the mask pattern 12 in the one surface of the base 110. Also, when the source material adsorbed to the base 110 reacts with the reactive material, a conductive layer containing copper (Cu), e.g., an electrode including a $Cu_3N$ layer, is formed on the one surface of the base 110 exposed by the mask pattern 12.

When the gate electrode 120 is formed on the one surface of the base 110 as described above, the conductive layer is not formed on a surface of the mask pattern 12. In other words, the source material for forming the electrode is not adsorbed or chemically bonded to the surface of the mask pattern 12 and does not react with the mask pattern 12. Thus, the $Cu_3N$ layer caused by the source material is formed only on the one surface of the base 11 exposed by the mask pattern 12 instead of being formed on the surface of the mask pattern 12.

When the process of forming the gate electrode 120 is finished, the base 110 is discharged from the chamber. Thereafter, the mask pattern 12 formed on the base 110 is removed.

Next, a gate insulation layer 130, an activation layer 140, and source and drain electrodes 150a and 150b are sequentially formed on the electrode formed by using the method in accordance with an exemplary embodiment, i.e., on the base 110 on which the gate electrode 120 is formed.

Here, the gate insulation layer 130 may be formed of one of an oxide layer and a nitride layer. The activation layer 140 may be formed of a IGZO thin-film obtained by doping indium (In) and gallium (Ga) to zinc oxide (ZnO). Also, the activation layer 140 may be formed of a IZO thin-film obtained by doping indium (In) to zinc oxide (ZnO) or a GZO thin-film obtained by doping gallium (Ga) to zinc oxide (ZnO). Each of the gate insulation layer 130 and the activation layer 140 may be formed by a chemical vapor deposition (CVD) method or an atomic layer deposition (ALD) method.

The source electrode 150a and the drain electrode 150b are disposed on the activation layer 140 and spaced apart from each other with the gate electrode 120 therebetween while partially overlapping the gate electrode 120. That is, the source electrode 150a and the drain electrode 150b may be spaced apart from each other on the activation layer 140. Also, the source electrode 150a and the drain electrode 150b may be formed by a sputtering method.

Hereinabove, the method of forming the gate electrode by using the method of forming the electrode in accordance with an exemplary embodiment is described. However, the exemplary embodiment is not limited thereto. For example, at least one of the source electrode 150a and the drain electrode 150b may be formed by method of forming the electrode in accordance with an exemplary embodiment.

To this end, the mask pattern 12 is formed on the activation layer 140 to expose an area on which the source and drain electrodes 150a and 150b are formed. Thereafter, when the source material containing copper (Cu) and the diethyl zinc $(Zn(C_2H_5)_2)$(DEZ) that is the reactive material are injected by the atomic layer deposition method, the source electrode 150a and the drain electrode 150b, which are made of $Cu_3N$, are formed.

When the source electrode 150a and the drain electrode 150b are formed, the mask pattern 12 is removed by using organic solvent or plasma formed by oxygen and hydrogen. The activation layer and the gate insulation layer, which are disposed below the source electrode 150a and the drain electrode 150b, are not affected even when the process of removing the mask pattern 12 is performed.

When the source electrode 150a and the drain electrode 150b are formed by the method in accordance with an exemplary embodiment as described above, a process of etching to expose the activation layer may be omitted. Thus, the process of forming the source electrode 150a and the drain electrode 150b may be simplified.

Hereinabove, an example of forming the source and drain electrodes 150a and 150b and the gate electrode 120 of the thin-film transistor by using the method in accordance with an exemplary embodiment is described. However, the exemplary embodiment is not limited thereto. For example, as described above, the method may be applied to a process of forming an anode electrode on a glass substrate or a flexible plastic substrate or forming a cathode electrode on an organic layer for manufacturing an organic light emitting device.

As described above, in an exemplary embodiment, the electrode 13 may be selectively formed on the one surface of the base 11 by performing the process of forming the electrode on the base 11 on which the mask pattern 12 is formed. Thus, a process of patterning the conductive layer after the conductive layer for forming the electrode is formed on the base 11 may be omitted. Thus, the process of forming the electrode 13 may be further simplified, and thus a production rate may improve.

Also, since the mask pattern 12 is made of the polymer material to which the material for forming the electrode is not or hardly adsorbed and which is not chemically bonded to or does not react with the material for forming the electrode, the conductive layer caused by the material for forming the electrode is not formed on the surface of the mask pattern 12.

Also, since the conductive layer is not formed on the mask pattern 12 when the electrode 13 is formed, a residue is not remained on the area of the base 11, on which the mask pattern 12 is formed, when the mask pattern 12 is removed. Thus, a defect caused by the residue may be prevented.

Also, since the conductive layer connected to the electrode is not formed on the mask pattern 12, the electrode may not be damaged in the process of removing the mask pattern 12 to prevent insulation breakdown of the electrode 13 from being generated.

In the exemplary embodiment, the electrode may be selectively formed on one surface of the base by performing the process of forming the electrode on the base on which the mask pattern made of the polymer is formed. Thus, the process of patterning the conductive layer after the conductive layer for forming the electrode is formed on the base may be omitted. Therefore, the process of forming the electrode may be further simplified, and thus the production rate may improve.

Also, since the mask pattern is made of the polymer material to which the material for forming the electrode is not or hardly adsorbed and which is not chemically bonded to or does not react with the material for forming the electrode, the thin-film caused by the material for forming the electrode is not formed on the surface of the mask pattern. As described above, since the thin-film is not formed on the mask pattern when the electrode is formed, the residue is not remained on the area of the base on which the mask pattern is formed. Thus, the defect caused by the residue may be prevented.

Also, since the thin-film connected to the electrode is not formed on the mask pattern, the electrode may not be damaged during the process of removing the mask pattern to prevent degradation in quality of the electrode.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of forming an electrode, comprising:
   loading, into a chamber, a base in which a partial area of one surface thereof is exposed by forming a mask pattern made of polymer on the one surface thereof; and
   forming a conductive layer containing copper on the partial area of the one surface of the base by alternately injecting a source material containing copper and a reactive material that reacts with the source material into the chamber and
   removing the mask pattern by using plasma that is generated by using hydrogen after the forming of the conductive layer is finished,
   wherein the base is one of a metal substrate, and a substrate on which a metal oxide layer is formed, and
   the metal substrate comprises germanium (Ge), and the substrate on which a metal oxide layer is formed is a substrate on which an IGZO thin-film is formed,
   wherein at least one of PtBMA (poly(tert-butyl methylacrylate)), PVP (poly(vinyl pyrrolidone)), PMAM (poly(methyl methacrylamide)), PS-b-PMMA (polystyrene-block-poly(methyl methacrylate)) is used as a mask material for forming the mask pattern.

2. The method of claim 1, wherein the conductive layer is formed on the exposed the one surface of the base by adsorbing the source material injected into the chamber to the exposed the one surface of the base and allowing the reactive material to react with the source material adsorbed to the base, and
   the adsorbing of the source material and the allowing of the reactive material to react with the source material are repeated a plurality of times.

3. The method of claim 2, wherein diethyl zinc (Zn($C_2H_5$)$_2$)(DEZ) is used as the reactive material.

4. The method of claim 1, wherein in the forming of the conductive layer, an inner temperature of the chamber is adjusted at 350° C. or less.

5. The method of claim 1, wherein the forming of the conductive layer comprises forming a secondary layer, which is performed after forming a primary layer, which is the forming of the conductive layer on the one surface of the base, to form an additional conductive layer on the conductive layer formed in the forming of the primary layer by performing electro-plating using the conductive layer formed in the forming of the primary layer as a seed.

* * * * *